(12) United States Patent
Evans et al.

(10) Patent No.: US 6,600,765 B2
(45) Date of Patent: Jul. 29, 2003

(54) HIGH-POWER COHERENT ARRAYS OF VERTICAL CAVITY SURFACE-EMITTING SEMICONDUCTING LASERS

(75) Inventors: Gary A. Evans, Plano, TX (US); Jay B. Kirk, Plano, TX (US); Jerome K. Butler, Richardson, TX (US)

(73) Assignee: Photodigm, Inc., Richardson, TX (US)

( * ) Notice: Subject to any disclaimer, the term of this patent is extended or adjusted under 35 U.S.C. 154(b) by 0 days.

(21) Appl. No.: 09/844,704

(22) Filed: Apr. 27, 2001

(65) Prior Publication Data

US 2002/0034205 A1 Mar. 21, 2002

Related U.S. Application Data

(60) Provisional application No. 60/200,603, filed on Apr. 28, 2000, provisional application No. 60/200,454, filed on Apr. 28, 2000, provisional application No. 60/209,822, filed on Jun. 6, 2000, provisional application No. 60/230,534, filed on Sep. 1, 2000, and provisional application No. 60/235,090, filed on Sep. 25, 2000.

(51) Int. Cl.$^7$ ................................. H01E 5/026

(52) U.S. Cl. ........................... 372/50; 372/96

(58) Field of Search ....................... 372/50, 96

(56) References Cited

U.S. PATENT DOCUMENTS

| | | | |
|---|---|---|---|
| 4,006,432 A | 2/1977 | Streiffer et al. | 372/96 |
| 4,919,507 A | 4/1990 | Evans et al. | 385/37 |
| 4,958,357 A | 9/1990 | Kinoshita | 372/96 |
| 5,673,284 A | 9/1997 | Congdon et al. | 372/50 |
| 5,970,081 A | 10/1999 | Hirayama et al. | 372/96 |
| 6,064,783 A | 5/2000 | Congdon et al. | 385/15 |
| 6,507,595 B1 * | 1/2003 | Kapon et al. | 372/45 |

OTHER PUBLICATIONS

"Surface Emitting Semiconductor Lasers and Arrays," Ed. Evans and Hammer, Academic Press, 1993; (No month).
"Research Toward Optical Fiber transmission Systems Part 1," Proc. IEEE, 61, 1703–1751, Dec. 1973.
"Optimized Couplers Between Junction lasers and Single Mode Fibers," Hammer, Neil, RCA laboratories, Princeton, NJ, Final Report, Aug. 31, 1981–Jan. 31, 1983.
"Observations and Theory of High Power Butt Coupling to LiNbO$_3$–type waveguides," Hammer and Neil, IEEE J. Quantum Electronics, QE–18, 1751–1758, Oct. 1982.
"Laser Diode End Fire Coupling into Ti:LiNbO$_3$ waveguides," Appl, Optics, 18, 2536–2537, Aug. 1979.
"Blow–Tie Surface Emitting Lasers," Bedford, R., Luo, H., Fallahi, M., IEEE Photonics Tech. Let., vol. 12, No. 8, Aug. 2000.
"Surface Emitting Distributed Feedback Quantum–Cascade Lasers," Schrenk, W. et al., Applied Physics Letters, vol. 77, No. 14, Oct. 2, 2000.
"Analysis of Grating Surface Emitting Lasers," Noll, R.J., Macomber, S.H., IEEE Journal of Quantum Electronics, vol. 26, No. 3, Mar. 1990.
"Facetless Bragg Reflector Surface–Emitting AlGaAs/GaAs Lasers Fabricated by Electron–Beam Lithography and Chemically Assisted Ion–Beam Etching," Tiberio, R.C., et al., J.Vac.Sci.Technol. B9 (6), Nov./Dec. 1991.

* cited by examiner

Primary Examiner—James Davie
(74) Attorney, Agent, or Firm—Duke W. Yee; Stephen J. Walder, Jr.

(57) ABSTRACT

An array of VCSELs is made to operate coherently by coupling light to and from all elements with a common waveguide. The common waveguide can be fabricated on the wafer or separately, and allows enough optical power to mix between the individual lasers for phase-locking to occur.

21 Claims, 6 Drawing Sheets

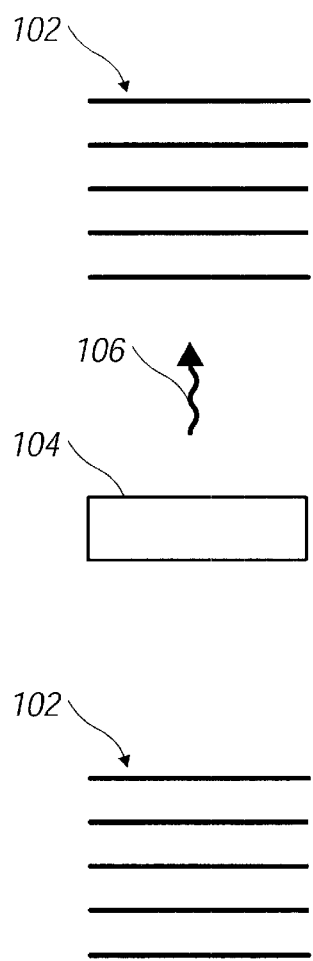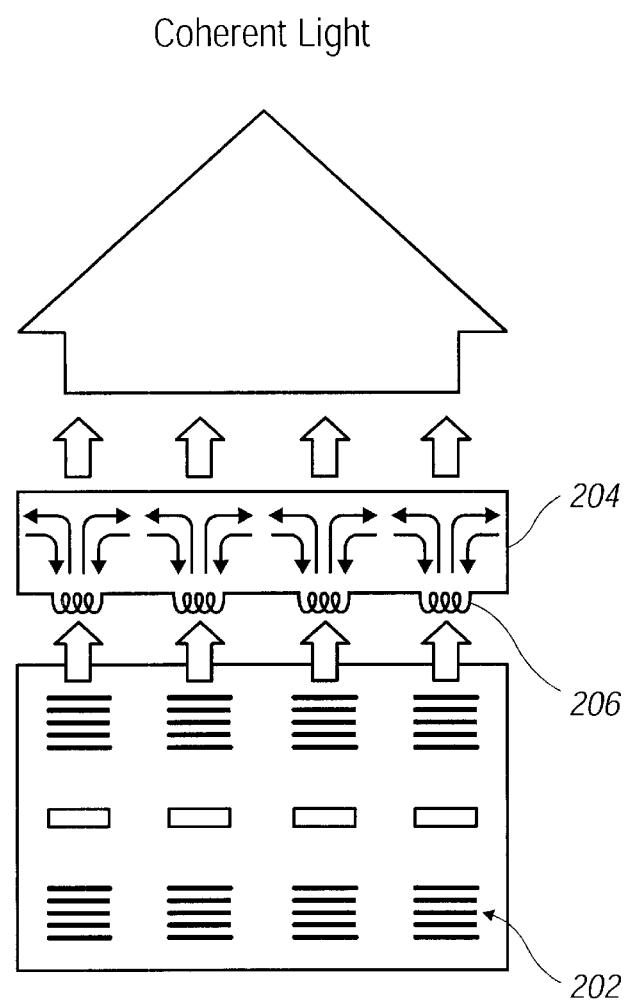
*FIG. 1 : VCSEL*      *FIG. 2a*

HIGH-POWER COHERENT ARRAYS OF VERTICAL CAVITY SURFACE-EMITTING SEMICONDUCTING LASERS

The present invention is related to and claims the benefit of priority to the following U.S. Provisional Patent Application Nos. 60/200,603 entitled "Grating-Outcoupled Surface-Emitting LEDs" filed on Apr. 28, 2000; 60/200,454 entitled "High-Power Coherent Arrays of Vertical Cavity Surface-Emitting Semiconducting Lasers" filed on Apr. 28, 2000; 60/209,822 entitled "Grating-Outcoupled Surface-Emitting Lasers" filed on Jun. 6, 2000; 60/230,534 entitled "Integrated Grating-Outcoupled Surface-Emitting Lasers" filed on Sep. 1, 2000; and 60/235,090 entitled "Coupling Grating-Outcoupled Surface-Emitting Lasers into Fibers" filed on Sep. 25, 2000.

BACKGROUND AND SUMMARY OF THE INVENTION

The present invention relates to semiconductor laser devices, and more particularly to vertical cavity surface emitting lasers (VCSELs).

BACKGROUND

VCSELs are important semiconductor laser sources for many applications, including telecommunications. Though VCSELs formed on a chip in arrays are individually coherent, the light from each individual VCSEL is not coherent with respect to the others because their phase and wavelength differ slightly, and are therefore uncorrelated. For such an incoherent array consisting of N elements producing some power P, the on-axis power in the far field is ~NP. However, if the array as a whole can be made to operate coherently (i.e., each individual VCSEL is coherent with the others), and in phase, the on-axis power in the far field is $N^2P$ and the width of the radiation pattern is reduced by ~1/N (compared to an incoherent array). This high on-axis far field power is required in laser applications such as free-space optical communications and laser radar where a large amount of power is required at a distance, or in applications such as laser welding, laser machining, and optical fiber coupling that require high power focused to a small spot.

The monolithic power combining approach described in the present application brings the proven technological and economic benefits demonstrated by combining transistors, capacitors, and resistors into large scale integrated circuits to integrated photonic circuits consisting of lasers, optical waveguides, and grating couplers. Presently, the cost of high power (500 to 1000 W) Nd:YAG and $CO_2$ lasers exceeds $100/Watt. Coherent VCSEL arrays can reduce this cost by one or two orders of magnitude. The cost advantage of VCSELs has been realized in local area network (LAN) markets where low power (<0.005 W) VCSEL based transceivers selling for about $100 dominate the market, having displaced more expensive edge emitting devices.

Other applications, such as optical pumps at 980 nm for erbium doped amplifying telecomm fibers will benefit from low cost lasers with increased power (0.05 W to 1 W). Such powers cannot be achieved with individual VCSELs but could easily be achieved with small VCSEL arrays. Aside from these commercial and economic applications, coherent arrays of VCSELs have far-reaching significance because they have the potential to deliver very high power (>>1 W) over a wide variety of wavelengths. Such a tool is certain to accelerate progress in medicine, communications, manufacturing, and national defense.

High-Power Coherent Array of VCSELs

The present application discloses an array of VCSELs which demonstrate coherent operation with respect to one another. In a preferred embodiment, coherent operation is obtained by using a waveguide which optically couples the lasers of the array. The waveguide couples the lasers with a periodic grating structure formed to capture a small part of the light from an individual laser, removing it from that laser's cavity, while also adding light to that laser's cavity from other lasers of the array. Thus the common waveguide both removes light from and adds light to each laser in the array, transferring enough optical power in the coupling exchange for phase locking to occur.

In one preferred embodiment, the common waveguide is located outside the monolithic VCSEL array, not being fabricated on the same wafer. In another preferred embodiment, the common waveguide is fabricated on the wafer with the VCSELs, and is located outside the cavity of the lasers, above them on the wafer structure. This approach avoids introducing complexity and losses into the individual VCSEL structure. In another preferred embodiment, the common waveguide is fabricated within the cavity, between the two reflectors of the VCSEL structure.

Advantages of the disclosed methods and structures, in various embodiments, can include one or more of the following:

1—provides a precise, controlled amount of coupling between array elements, independent of the element size and spacing;

2—can include phase adjustors to assist in beam formation and electronic beam steering (the phase adjustors can be a VCSEL element operating at below lasing threshold, where variations in current correspond to significant changes in the effective index of refraction in the gain region, and therefore the effective optical length of the corresponding waveguide segment.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 1 shows a VCSEL consistent with a preferred embodiment.

FIG. 2a shows one embodiment of the present innovations.

FIG. 2b shows a detail of the waveguide and grating from FIG. 2a.

FIG. 4b shows a detail of the waveguide and grating from FIG. 4a.

DETAILED DESCRIPTION OF THE PREFERRED EMBODIMENTS

Figure 2B:
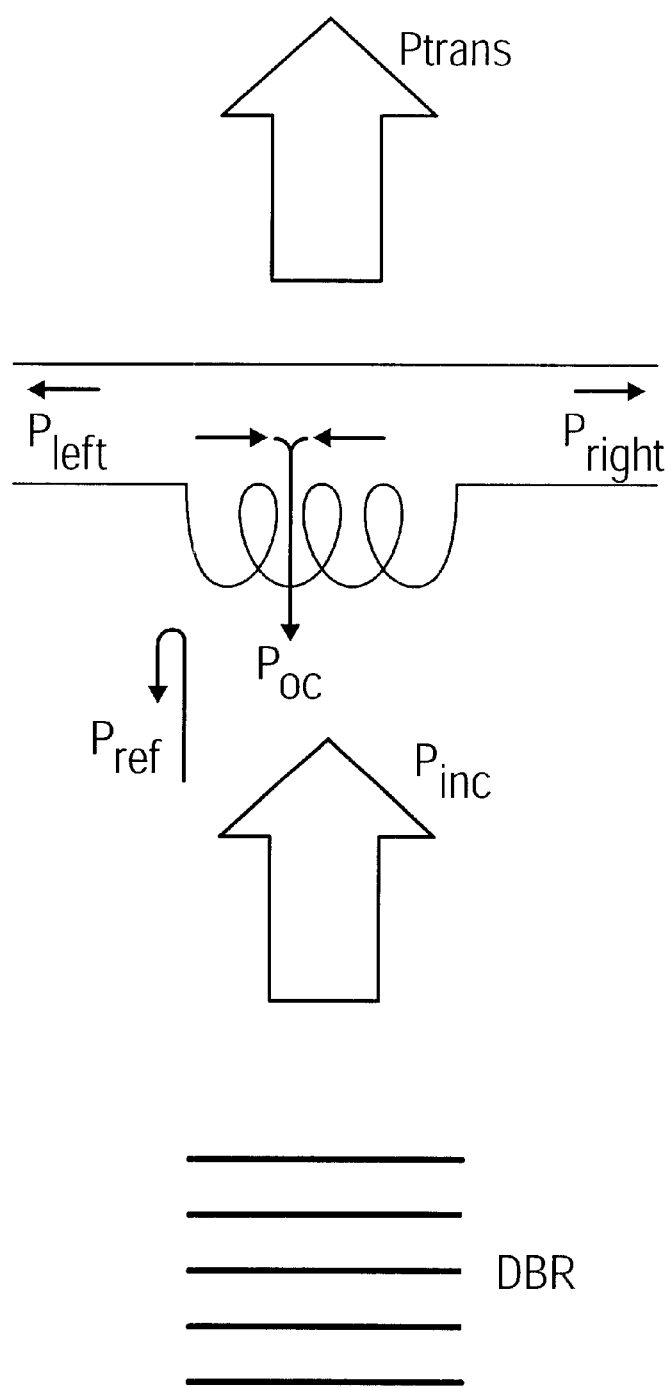

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

FIG. 1 shows an individual VCSEL laser consistent with the innovations herein disclosed. The device is a small optical oscillator and is fabricated on a semiconductor wafer. Each laser comprises a vertical stack of components. Two DBR mirrors 102 are used, one at either end of the laser cavity, and an active region 104 is located between the reflectors. The active region, or gain region, is made up of one or more quantum wells separated by barrier layers. When current is injected into the device, electrons and holes recombine in the gain region, producing photons 106. These photons reflect off the DBRs at either end, providing feedback and causing the device to lase. The top mirror is partially transparent and allows light to escape through the surface of the device.

The DBRs are formed by patterning and etching the surface according to the necessary period and dimensions of the reflectors. The active region is formed with quantum wells, preferably using selective growth of epitaxial silicon.

FIG. 2a shows a first embodiment of the present innovations. It comprises a linear array of VCSEL 202 devices formed on the same substrate. In this example, viewed from the side, four VCSELs are shown on a single substrate. Each VCSEL of course emits coherent light, but the different VCSELs are not a priori coherent with respect to one another because their phases and frequencies will differ slightly.

A waveguide 204 is shown above the VCSEL structures. In this embodiment, the waveguide is not integrated with the VCSELs, being fabricated separate from the wafer. In the preferred embodiment, the waveguide is made from epitaxial silicon. Other materials can be used for the waveguide, such as an optical polymer, for example. The waveguide has a grating 206 with the period necessary to couple light into and out of the VCSELs. This grating period is calculated from Lambda=lam0/neff, where lam0 is the free space wavelength of the light and neff is the effective index of refraction for the coupling waveguide.

The figure shows the light that is emitted by the VCSELs and which passes through the waveguide with a thick solid arrow. This light is emitted perpendicularly from the surface of the VCSELs. The figure also shows the light passing to and from the VCSELs and the waveguide, denoted by smaller arrows.

FIG. 2b shows a detailed view of the waveguide and grating structure. A DBR from the VCSEL allows light (Pinc) to transmit through, which is incident on the waveguide. Some of this light reflects back into the VCSEL (Pref), while some enters the waveguide and stays there, propagating left (Pleft) and right (Pright) to other VCSEL elements. Likewise, light from the other VCSEL elements which is already in the waveguide is outcoupled from the waveguide and enters the VCSEL as Poc. Finally, light that transmits through the waveguide and is emitted at the surface of the device (Ptrans) is shown by a large arrow.

Figure 3:
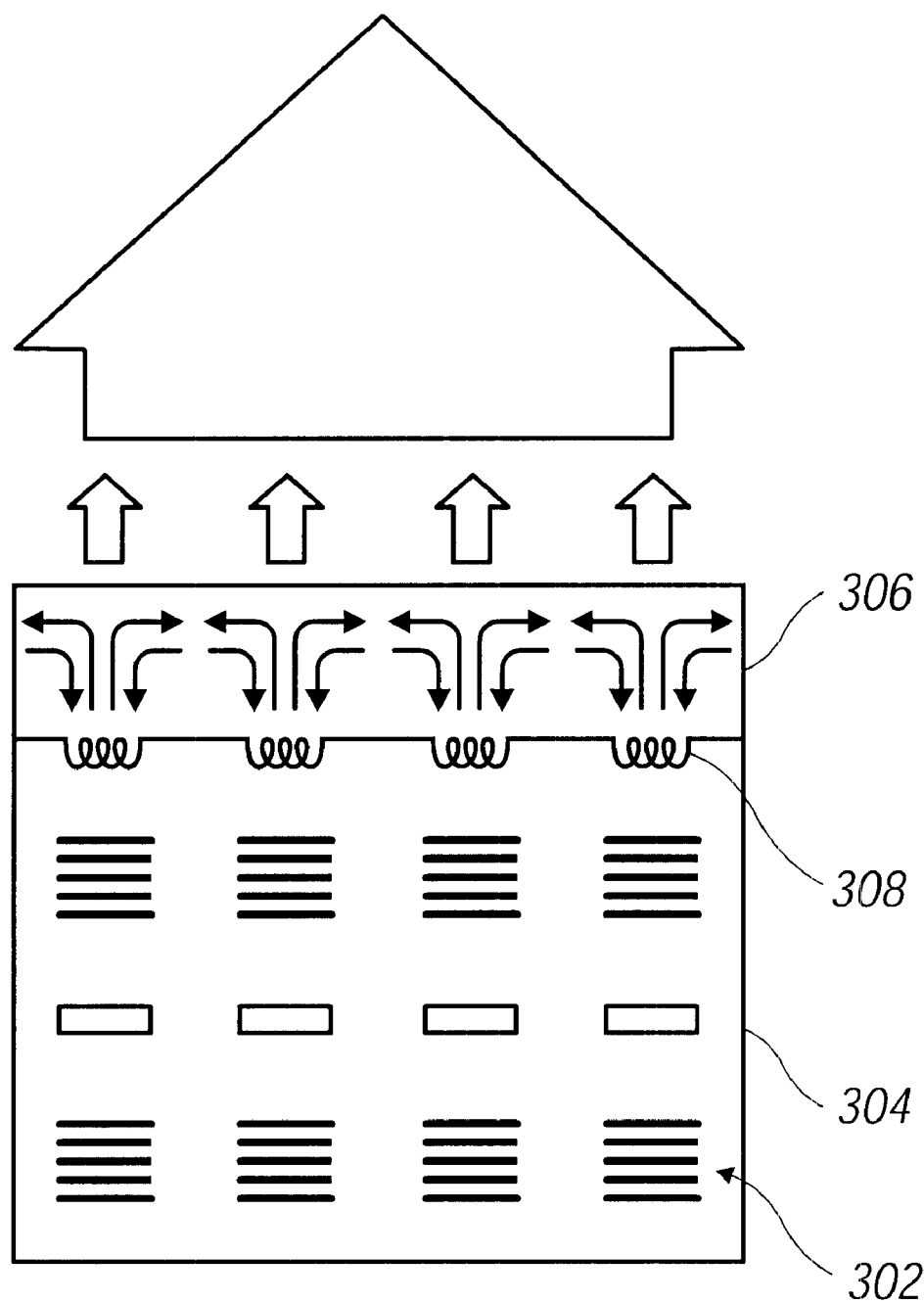
FIG. 3 shows another embodiment of the present innovations.

FIG. 3 shows another embodiment of the present innovations. A linear array of VCSELs 302 is formed on a semiconductor substrate 304. The VCSELs each comprise a set of DBR mirrors to provide feedback in the cavity from photons emitted by electron hole recombination in the pumped active area. One DBR is slightly transmissive to allow light to escape the cavity and be emitted out the top of the device. Integrated on this same wafer is a common waveguide that couples light to and from all the VCSEL elements. This design integrates the coupling waveguide 306 above the VCSELs. The waveguide will intercept photons in this region, coupling a fraction (about one percent in a sample embodiment) of the single pass optical power incident on the waveguide out of the laser cavity, enough to allow phase-locking to occur. The same amount of power is also coupled from the waveguide into each VCSEL in the array, providing enough coupling exchange to phase lock the different VCSELs of the array, making them operate coherently with respect to one another. The degree of coupling can be controlled to achieve whatever amount is necessary to get coherent outputs.

This innovative approach avoids introducing complexity and losses into the basic VCSEL elements, and allows testing the VCSEL elements on a portion of the wafer before the waveguide is fabricated. The coupling waveguide (preferably formed of similar epitaxial material to that of the VCSEL layers, but possibly formed from other materials such as an optical polymer) will have the appropriate composition to guide light. The waveguide layer will have a grating at or near the core region of the waveguide. The grating may be formed holographically or by other common means such as direct electron beam writing or by phase-shift masks into a recording medium and then etched into the exposed surface. The grating period Lambda required to couple light into the VCSEL elements is typically about 0.25 microns for light of wavelength 0.85 microns.

The waveguide shown in the figure can have the grating 308 formed on the bottom (buried), or on the top surface of the device. This latter configuration is preferred in that it allows the growth of the waveguide (preferably epi) to be done before the grating is formed, making a good epi layer easier to grow. The grating is then etched on top of the device.

Figure 4A:
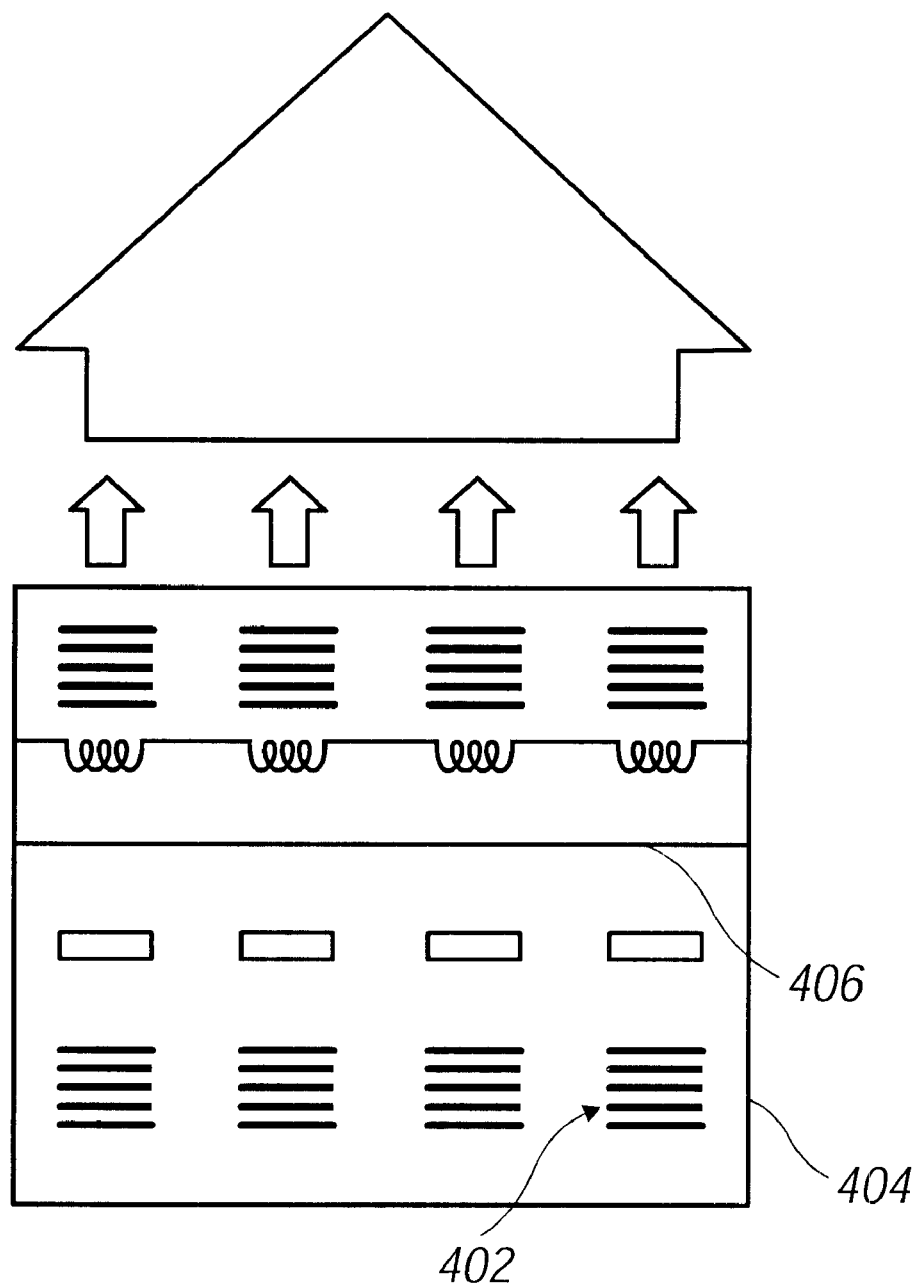
FIG. 4a shows another embodiment of the present innovations.

FIG. 4a shows another embodiment of the present innovations. In this example, a linear array of VCSEL lasers 402 is seen from a side view. The lasers are formed on a semiconductor substrate 404, and comprise a set of DBR mirrors and an active area, as in previously discussed examples. (Of course, it is noted that other kinds of reflectors can be used consistent with the herein disclosed ideas, and the present application is not limited to the exact examples mentioned here.)

In this variation, the waveguide 406 is integrated on the same wafer as the lasers and fabricated during the process. The coupling waveguide structure is integrated between the two DBR mirrors of this example, and is preferably made from epitaxial material, such as AlGaAs/AlAs/GaAs with AlGaAs, InGaAs, or AlInGaAs for the quantum well(s) if the emission wavelengths are in the range of about 800 nm to 1000 nm. For emission at other wavelengths, such as 630 to 680 nm (red light), the AlGaInP/GaAs material system can be used. For longer telecommunication wavelengths, InGaAsP/InP or AlGaInAs/InP can be used, although more exotic compounds may also work. (The figure shows the waveguide positioned above the active region, but it could also be below this region.)

The waveguide will intercept photons in this region, coupling a (generally small) fraction of the single pass optical power incident on the waveguide out of the laser cavity. The same amount of power is also coupled from the waveguide into each VCSEL in the array, providing enough coupling exchange to phase lock the different VCSELs of the array, making them operate coherently with respect to one another.

Figure 4B:
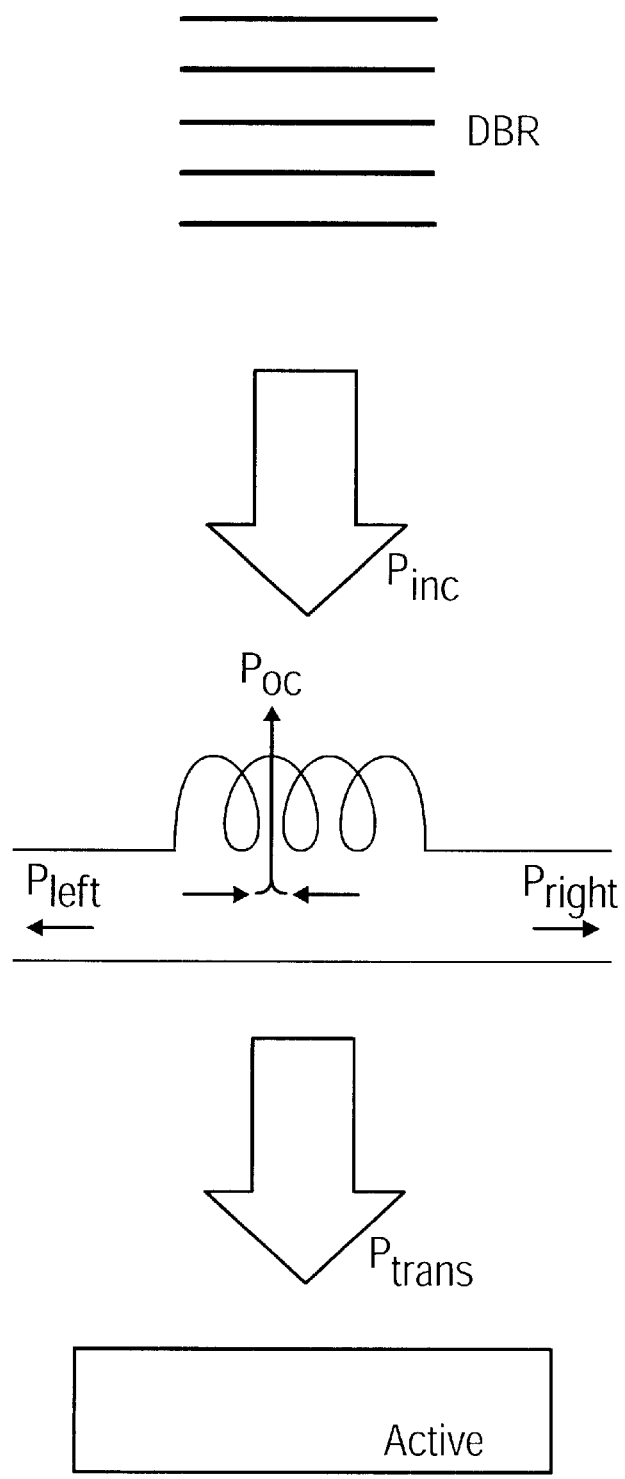

FIG. 4b shows a close up of the waveguide from FIG. 4a. Light reflected from the DBR is incident on the waveguide's grating, Pinc. Some of this light couples to the waveguide and propagates therein as Pright and Pleft, headed to other VCSEL elements. Likewise, light from other VCSEL elements is outcoupled Poc to the VCSEL shown in the figure. This exchange of light allows phase locking of the devices. The remainder of the light transmits through the waveguide as Ptrans, which oscillates within the cavity for another pass. Light is emitted from the device through the top surface of the DBR.

To fabricate this structure, the first DBR mirror, active region, and the part of the coupling waveguide up to the grating surface are grown. The grating is then fabricated, the remainder of the VCSEL structure is then grown, and the n- and p-sides are metallized.

Testing usually consists of measuring the light-current (L-I) curves, far-field, near-fields, and spectra of the devices. The last three measurements mentioned, taken together, indicate the degree of phase-locking and coherence of the array. Other means of testing the lasers include leaving some lasers uncoupled on the wafer while connecting the rest with the common waveguide. The uncoupled lasers can then be more easily tested. Light from the lasers can also be tested by adding a sacrificial layer to the waveguide which spoils the necessary index of refraction conditions for internal reflection, allowing light to escape, which can then be tested. After testing, the sacrificial layer is then removed, restoring the internal reflection properties of the waveguide.

Figure 5:
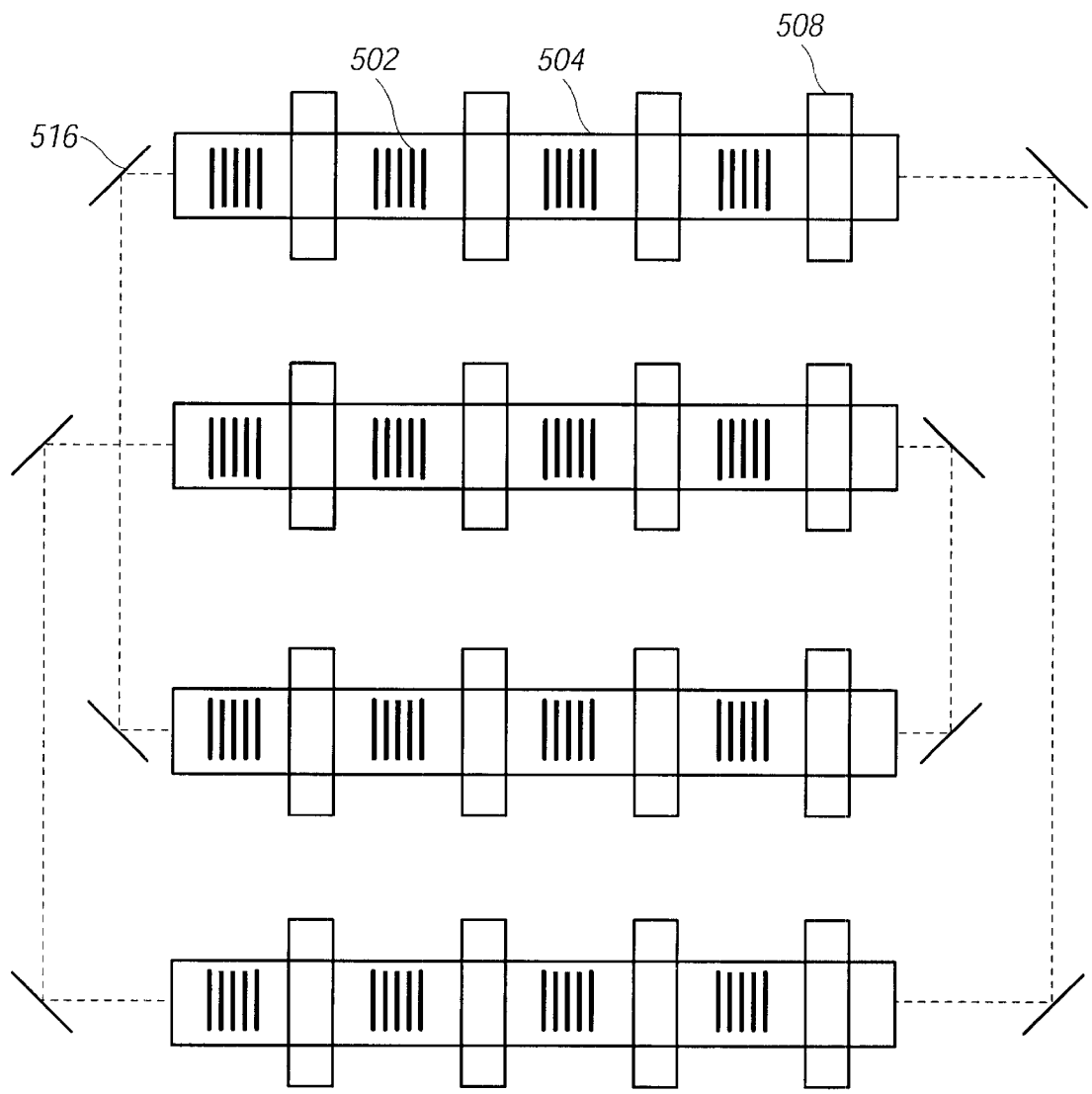
FIG. 5 shows a two dimensional array of VCSEL elements according to a preferred embodiment.

In previous examples, one-dimensional arrays of elements have been used as an example of the innovative VCSEL system. The idea can also be extended to a two-dimensional array with the integration of total internal reflection corner turning mirrors as indicated in FIG. 5. Of course, other reflectors may be used, such as external prism couplers. Coherent single frequency two-dimensional serpentine and ring laser arrays have been demonstrated with both corner turning techniques. (See "Surface Emitting Semiconducting Lasers and Arrays," Ed. Gary Evans and Jacob Hammer, Academic Press, 1993, which is hereby incorporated by reference.)

FIG. 5 shows a two-dimensional VCSEL array according to a preferred embodiment. In this example, a 4×4 ring VCSEL array, having 16 elements, is seen from the top view. The VCSELs 502 are arranged in rows with the waveguide 504 connecting different elements in a row. Different rows are optically connected using corner turning mirrors 506 in this example.

Phase adjustors 508 can be added to the system to assist in beam forming and electronic beam steering. In one possible implementation of this idea, the phase adjustors are added between the VCSEL elements on the waveguide, one for each element preferably. The phase adjustors can be other VCSEL elements operated below threshold, where changes in applied current correspond to a change in effective index of refraction, for example. Alternatively, phase adjustment can be implemented with a series of micro-electrical-mechanical (MEM) metal fingers of which one or more are brought into contact with a section of the waveguide. The metal finger in contact with the dielectric waveguide changes the propagation constant and therefore the phase of the light. By varying phase with such systems, the emitted light from the VCSELs can be electronically steered and shaped. Phase adjustors can be used to control the shape of the output beam or to direct the total beam in a direction as desired, as in phased array radar antenna steering. A possible location for the phase adjustors is indicated in FIG. 5.

Definitions:

Following are short definitions of the usual meanings of some of the technical terms which are used in the present application. (However, those of ordinary skill will recognize whether the context requires a different meaning.) Additional definitions can be found in the standard technical dictionaries and journals.

VCSEL: vertical cavity surface emitting laser.

DBR: distributed Bragg reflector.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

For example, the specific materials mentioned in the present application are not the only possible ones consistent with the innovations herein disclosed. The scope of the ideas apply to new semiconductor and other materials which may become available.

What is claimed is:

1. A solid state photonics system, comprising:
    an array of vertical cavity surface emitting lasers; and
    a common waveguide connected to the array of vertical cavity surface emitting lasers, wherein the common waveguide couples light from individual vertical cavity surface emitting lasers of the array to other individual vertical cavity surface emitting lasers in the array in a manner such that all vertical cavity surface emitting lasers of the array operate coherently with respect to one another.

2. The system of claim 1, wherein said waveguide is positioned above the array such that light passing through one reflector of each vertical cavity surface emitting laser of the array and enters the waveguide.

3. The system of claim 1, wherein the waveguide intersects a cavity of each vertical cavity surface emitting laser of the array.

4. The system of claim 1, wherein the waveguide is formed of epitaxial material.

5. The system of claim 1, wherein the waveguide is formed on the surface of said device and is made of an optical polymer.

6. A solid state photonics system, comprising:
    a plurality of vertical cavity surface emitting lasers; and
    a common waveguide coupled to the plurality of vertical cavity surface emitting lasers, wherein the vertical cavity surface emitting lasers exchange photons from one another through the common waveguide, and wherein the vertical cavity surface emitting lasers and common waveguide are fabricated on a common wafer.

7. The integrated circuit of claim 6, wherein the common waveguide intersects a cavity of each vertical cavity surface emitting laser.

8. The integrated circuit of claim 6, further comprising phase adjustors connected to the common waveguide, wherein the phase adjustors modify the phase of light from the vertical cavity surface emitting lasers.

9. The integrated circuit of claim 8, wherein the phase adjustors arc used to control the light emitted from the system.

10. The integrated circuit of claim 6, wherein the vertical cavity surface emitting lasers operate coherently with respect to one another.

11. A solid state photonics system, comprising:
an array of vertical cavity surface emitting lasers; and
a waveguide connected to the array of vertical cavity surface emitting lasers, wherein the common waveguide couples light between the vertical cavity surface emitting lasers such that substantially the same amount of light coupled from a first vertical cavity surface emitting laser of the array is coupled to a first vertical cavity surface emitting laser from the waveguide;
wherein the waveguide comprises periodic gratings which couple light into and out of the vertical cavity surface emitting lasers such that the vertical cavity surface emitting lasers operate coherently with respect to one another.

12. The system of claim 11, wherein the waveguide optically connects to each vertical cavity surface emitting laser of the system between reflectors of each of the vertical cavity surface emitting lasers.

13. The system of claim 11, further comprising phase adjustors integrated with the waveguide.

14. The system of claim 11, wherein the waveguide is optically connected to each of the vertical cavity surface emitting lasers outside a cavity of the vertical cavity surface emitting lasers.

15. A method of providing a solid slate photonics system, comprising:
providing a plurality of vertical cavity surface emitting lasers;
providing a common waveguide; and
coupling the plurality of vertical cavity surface emitting lasers using the common waveguide, the waveguide having periodic gratings which couple light into and out of the vertical cavity surface omitting lasers in such a mariner that the plurality of vertical cavity surface emitting lasers operate coherently with respect to one another.

16. The method of claim 15, further comprising providing phase adjustors that are used to steer a beam emitted from the solid state photonics system.

17. The method of claim 15, wherein the waveguide is formed from epitaxial material.

18. A method of providing a vertical cavity surface emitting laser system, comprising:
providing a plurality of vertical cavity lasers, each vertical cavity laser comprising a reflector, a gain region, and another reflector in a stack; and
providing a waveguide optically connected to each vertical cavity laser, the waveguide being fabricated on a same wafer as the vertical cavity lasers, wherein the vertical cavity lasers exchange photons via the waveguide such that the vertical cavity lasers operate coherently with respect to one another.

19. The method of claim 18, wherein the waveguide optically connects to the vertical cavity lasers at a location above the gain region and below one of the reflectors.

20. The method of claim 18, wherein the waveguide optically connects to the vertical cavity lasers at a location above one of the reflectors and below the gain region.

21. The method of claim 18, wherein the waveguide is fabricated on top of the vertical cavity lasers, and wherein the waveguide includes gratings to couple light to and from the vertical cavity lasers.

* * * * *

UNITED STATES PATENT AND TRADEMARK OFFICE
CERTIFICATE OF CORRECTION

PATENT NO. : 6,600,765 B2
DATED : July 29, 2003
INVENTOR(S) : Evans et al.

It is certified that error appears in the above-identified patent and that said Letters Patent is hereby corrected as shown below:

Column 6,
Line 63, after "adjustors", delete "arc" and insert -- are --.

Column 7,
Line 26, after "solid", delete "slate" and insert -- state --.

Column 8,
Line 3, after "a", delete "mariner" and insert -- manner --.

Signed and Sealed this

Third Day of February, 2004

JON W. DUDAS
*Acting Director of the United States Patent and Trademark Office*